(12) United States Patent
Karabatsos

(10) Patent No.: US 7,193,444 B1
(45) Date of Patent: Mar. 20, 2007

(54) HIGH SPEED DATA BIT LATCH CIRCUIT

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 15 days.

(21) Appl. No.: 11/163,501

(22) Filed: Oct. 20, 2005

(51) Int. Cl.
H03K 19/00 (2006.01)

(52) U.S. Cl. .............................. 326/93; 326/44; 326/96; 327/217; 327/218

(58) Field of Classification Search ............ 326/93–98; 327/200–202, 215–219, 225
See application file for complete search history.

(56) References Cited

U.S. PATENT DOCUMENTS 5,557,225 A * 9/1996 Denham et al. ............ 327/199

2005/0001488 A1* 1/2005 Yamada ...................... 307/106

* cited by examiner

Primary Examiner—Anh Q. Tran
(74) Attorney, Agent, or Firm—Mark P. White

(57) ABSTRACT

A latching circuit having a clock signal input and a data input, includes an inverting delay circuit having an input connected to DATA IN and having an output signal s1, a NAND circuit having a first input connected to signal s1, a second input connected to the clock signal, and an output signal s2, an OR circuit having a first input connected to the data input, a second input connected to s2, and an output signal s3, and a FLIP-FLOP circuit whose first input is connected to s2, whose second input connected to s3, and whose output is OUT Q.

7 Claims, 6 Drawing Sheets

LATCH LOGIC

FUNCTION TABLE

| INPUTS | | | | OUTPUTS | |
|---|---|---|---|---|---|
| PRE | CLR | CLK | D | Q | Q̄ |
| ↓ | H | X | X | H | L |
| X | ↓ | X | X | L | H |
| H | H | ↑ | H | H | L |
| H | H | ↑ | L | L | H |
| H | H | L | X | $Q_0$ | $\bar{Q}_0$ |

Timing Requirements
over recommended operating free-air temperature range (unless otherwise noted) (see Figure 1)

| | | | $V_{CC}$ = 0.8 V | $V_{CC}$ = 1.2 V ± 0.1 V | | $V_{CC}$ = 1.5 V ± 0.1 V | | $V_{CC}$ = 1.8 V ± 0.15 V | | $V_{CC}$ = 2.5 V ± 0.2 V | | UNIT |
|---|---|---|---|---|---|---|---|---|---|---|---|---|
| | | | TYP | MIN | MAX | MIN | MAX | MIN | MAX | MIN | MAX | |
| $f_{clock}$ | Clock frequency | | 50 | | 200 | | 225 | | 250 | | 275 | MHz |
| $t_w$ | Pulse duration | CLK | 2 | 1 | | 1 | | 1 | | 1 | | ns |
| | | PRE or CLR low | 5 | 1.5 | | | | | | | | |
| $t_{su}$ | Setup time before CLK* | Data | 2.2 | 0.6 | | 0.5 | | 0.5 | | 0.4 | | ns |
| | | PRE or CLR inactive | 2.9 | 1.6 | | 0.9 | | 0.7 | | 0.4 | | |
| $t_h$ | Hold time, data after CLK* | | 1.2 | 0.5 | | 0.4 | | 0.3 | | 0.3 | | ns |

Switching Characteristics
over recommended operating free-air temperature range, $C_L$ = 15 pF (unless otherwise noted) (see Figure 1)

| PARAMETER | FROM (INPUT) | TO (OUTPUT) | $V_{CC}$ = 0.8 V | $V_{CC}$ = 1.2 V ± 0.1 V | | | $V_{CC}$ = 1.5 V ± 0.1 V | | $V_{CC}$ = 1.8 V ± 0.15 V | | | $V_{CC}$ = 2.5 V ± 0.2 V | | UNIT |
|---|---|---|---|---|---|---|---|---|---|---|---|---|---|---|
| | | | TYP | MIN | | MAX | MIN | MAX | MIN | TYP | MAX | MIN | MAX | |
| $f_{max}$ | | | 50 | 200 | | | 225 | | 250 | | | 275 | | MHz |
| $t_{pd}$ | CLK | Q | 10.3 | 1.7 | | 3.7 | 1.2 | 2.5 | 1.2 | 1.5 | 1.7 | 0.8 | 1.2 | ns |
| | | Q̄ | 9.6 | 1 | | 3.8 | 1 | 3 | 1.1 | | 1.5 | 0.7 | 1.1 | |
| | PRE or CLR | Q or Q̄ | 12.9 | 2 | | 4.5 | 0.9 | 3.1 | 1.5 | | 2.2 | 0.9 | 1.5 | |

Fig. 3

LATCH LOGIC

LATCH LOGIC

HIGH SPEED DATA BIT LATCH CIRCUIT

BACKGROUND OF INVENTION

The computer industry, with the advances of silicon technology, is constantly faced with the complexities of high speed data busses. The high speed of microprocessor CPUs requires a high speed data bus between the memory sub-system and the front end CPU data bus. However, speed without density of memory is an unbalanced combination. Modern computer systems require increasingly large RAM arrays, and these arrays are packaged in modules of approximately the same size as used in previous, lower capacity memories. Thus, the density of the memory modules, in bits or bytes per square inch of circuit board, is constantly increasing.

The CPU by itself cannot increase computer performance without a high speed memory sub-system and without such a high speed memory the CPU does not perform at the speed it was designed for. When memory access is substantially slower than CPU speed a bottleneck is created between memory and CPU Front End bus. With advances of the Internet, complex application programs and operating systems, memory sub-systems with high-density memory modules have become a necessity.

However, as the density of memory goes up, the capacitive loading of each data bit of the data bus increases. With the increase of the capacitive loading on the data bus, the driver of the data bit line is taxed for higher driving capability. As is well known, when the capacitive loading on a data line increases, the speed at which the corresponding driver circuit can change state on the data line decreases. Thus, on a given data line, the capacitive loading and the speed of data transfer are inversely proportional.

Many bus schemes have been designed to maximize speed in memory modules having increasing memory density. For that purpose, circuits utilizing pass gate switches have been designed into the data path to isolate and reduce the capacitive loading. Patents granted to the present inventor, Chris Karabatsos, include U.S. Pat. Nos. 6,446,158, 6,737,691, and 6,854,042, all intended to remedy this problem.

There are several factors to be considered in the design of such bus circuits transmitting pulse widths in the nanosecond and sub nanosecond range. Solutions include the following:

(a) Data bus widths must be broad enough to satisfy wide data bus requirements of the modern CPU.

(b) High Memory density must be maintained on the same data bus. That is, more Memory Modules are attached to the same data bus, and more connectors appear on the motherboard attached to the bus.

(c) The presence of parasitic resistors, inductors and capacitors (RLC) in the structure of the data bus and on the devices, including connectors, memory modules, printed circuit boards, memory chips and logic chips connected to the bus must be overcome.

(d) Effects of the physical RLC quantities affecting the overall speed by which data can be transported on the bus and thus affecting the overall performance and bandwidth of such bus.

(e) Synchronization of the Data signals and Strobe signals required to latch the data at the destination receiver.

Solutions to these problems in the prior art disclosed systems having dual data banks in which the data rate at each data bank is one-half the data rate at the memory subsystem bus have been described in inventions referenced above.

However, further increases in computer speed have created synchronization and data capturing problems in the reading and writing of data between the system bus and the memory banks either directly or indirectly, as described in said prior art.

The present invention provides a significant improvement in memory data rate speed and accuracy with substantial improvement in synchronization between the strobes and data in either direction of transmission and reception and better quality of signal over the prior art. This is accomplished by generating strobe signals and data signals which are synchronized with each other at both ends of the computer DATA BUS memory subsystem.

There are three elements described herein that will allow the high speed reception and transmission of data bits and a termination scheme to reduce reflections and allow multi-drop memory data bit connections in the memory high speed subsystem.

The three elements are:

(a) A high speed data bit latch circuit
(b) A high speed data bit driver circuit
(c) A termination arrangement for high speed data rate multi-drop data bit connections.

The first of these elements is described in the following description of the preferred embodiments of this invention.

SUMMARY OF THE INVENTION

It is an object of this invention to provide a latching circuit which requires no setup time and a minimal hold time, and still latches reliably.

In accordance with one aspect of the invention the latching circuit of the present invention has inputs comprising a clock CLK signal and an input signal DATA IN, and an output signal OUT Q.

In accordance with a second aspect of the invention, the circuit includes a delay circuit, whose input is connected to DATA IN, and having an output signal s1.

In accordance with a third aspect of the invention the circuit further includes a NAND circuit having a first input connected to signal s1, a second input connected to the clock signal, and an output signal s2.

In accordance with a fourth aspect of the invention, the circuit further includes an OR circuit having a first input connected to DATA IN, a second input connected to s2, and an output signal s3.

In accordance with a fourth aspect of the invention the circuit further includes a FLIP-FLOP circuit having a first input connected to s2, a second input connected to s3, and whose output is OUT Q.

In accordance with a fifth aspect of the invention the delay circuit creates a delay of three time increments each equal to tD, wherein the clock CLK has a period of 12 tD, and wherein the NAND circuit, the OR circuit, and the FLIP-FLOP circuit each have a delay equal to tD.

In accordance with a sixth aspect of the invention the delay circuit consists of three inverters connected in series.

In accordance with a seventh aspect of the invention the flip-flop circuit includes two NAND gates, each having a first and second input and an output, and wherein the first input of the first NAND gate is connected to signal 4c, the second input of the first NAND gate is connected to the output of the second NAND gate, the first input of the second NAND gate is connected to the output of the first NAND gate, and the second input of the second NAND gate is connected to signal 7c.

BRIEF DESCRIPTION OF DRAWINGS

The invention will be more fully described in the following detailed description in conjunction with the drawings in which:

FIG. 3 depicts the bottom half of a data sheet for the prior art latching circuit, Texas Instruments SN74AUV1G74.

DESCRIPTION OF THE PREFERRED EMBODIMENTS

For this disclosure it is assumed that the data is latched into the latching element with the transition of the clock edge from Low to High level. The data must be presented to the data input of the latch within a specified minimum time after the rising edge of the applied clock to the latch and it must also stay active for a specified minimum time after the rising edge of the clock.

Once these times are satisfied, the value of data at the input will be preserved at the output of the latch until the next rising edge of the clock when the new data input value will be sampled and stored into the latch to be preserved until the following rising clock edge. After the specified DATA hold times, the data could change value at the input of the latch without affecting the latched data value at the output. The output of the latch will only change with the rising edge of the clock and the data value as specified.

Figures 1A, 1B:
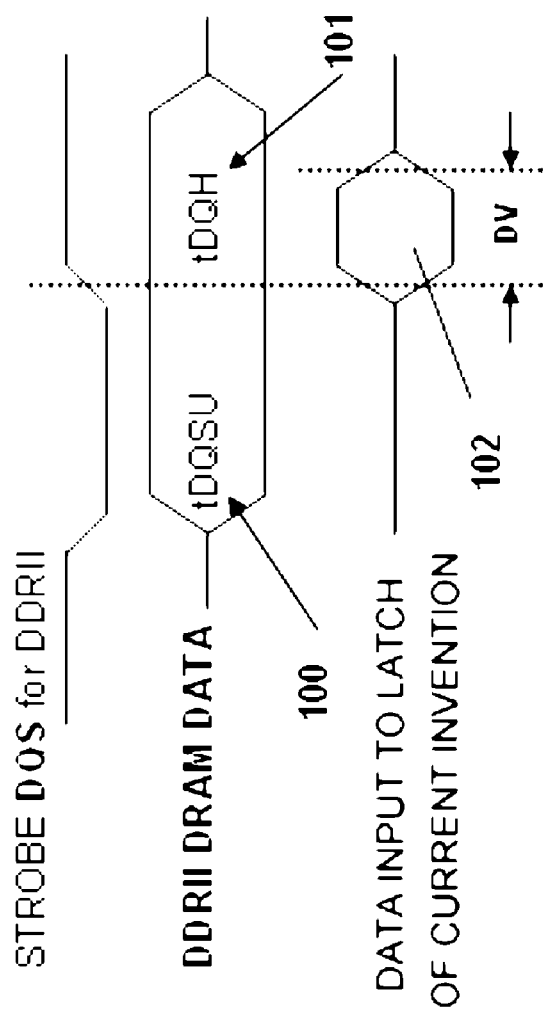
FIG. 1a depicts electronic waveforms of the prior art and current latching circuit.
FIG. 1b is a table showing latch timings of the circuits of the prior art and the current invention.

In implementations of the prior art, the clock and the data reaching the latch are arranged in a time relationship so that the data leads the edge of the clock no less than the specified required time for that latch. Referring to FIG. 1B, a timing drawing is shown to define the setup and hold times in relation to the rising edge of the clock pulse. This table shows published setup and hold times as defined by the DRAM manufacturers for DDRII DRAM devices of the data rates shown. The DDRII DRAM is a DDR (Double Data Rate) type DRAM that enables data to be read or written twice every clock cycle. DDRII is a second generation of the DDR architecture.

In contrast, the latch of the current invention is shown to require a very short pulse-width without any setup time. Instead, this pulse is required to be present after the clock. The timing relationships will be further explained in FIG. 4 and FIG. 5.

Figures 2A, 2B:
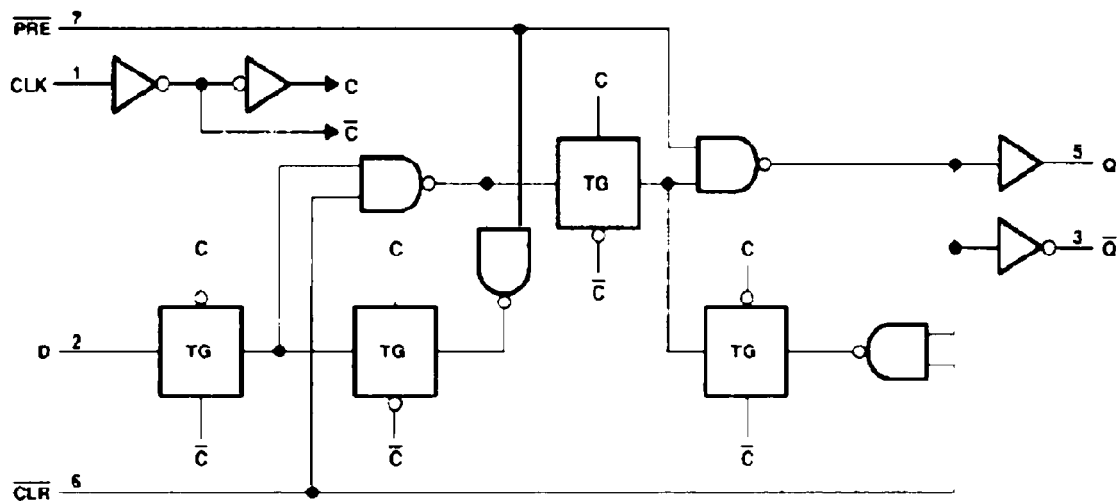
FIG. 2A depicts the logic diagram for the prior art latching circuit, Texas Instruments SN74AUV1G74®.
FIG. 2B depicts the circuit diagram for the prior art latching circuit, Texas Instruments SN74AUV1G74.

Referring to FIGS. 2A and 2B, a specification sheet of the prior art device SN74AUC1G74, sold by Texas Instruments® shows the construction of the latch in logic blocks.

Referring to FIG. 3, a copy of the timing specification of device SN74AUC1G74 shows the setup and hold times to contrast to the proposed latch timings.

The present invention presents a radical improvement over the prior art. The latching element described herein does not require the setup time of the customary latches and does not require a mid-point centering of the data strobe.

The present invention provides a significant improvement in data rate speed and accuracy with substantial improvement in synchronization between the strobes and data in either direction of transmission and reception.

For the high speed data busses of today's technologies, the duration of the data valid pulse is very small (in the low pico-second range) and the duration of the clock pulse is also small. It is assumed for this example that the data valid pulse duration is equal to the clock pulse duration and equal to one nanosecond. Assuming further that the latching element is of such speed that the prior art latch shown in FIG. 2B, has a required minimum pulse width of data of 700 pico-seconds, 400 for set up and 300 for hold as shown in the table of FIG. 3 labeled "Timing Requirements" under column VCC=2.5 volts, it leaves only 300 pico-seconds of extra time for data valid. If one were to center the clock edge at mid point of the data valid pulse, then there would be only 100 pico-seconds of margin time for set up and 200 for hold.

These margin times are available under ideal conditions that do not exist in practice because during transmission the clock and data signals suffer variations of quality and time jitters due to the jitter or fluctuations of the clock that generated the signals, and further from transmission line effects and jitters of the media such as printed circuit boards and/or optical media. Therefore, there is a constant challenge to find ways to transmit the data and clock with the least amount of jitter.

Referring now to FIG. 1A, it is seen that the prior art latch requires the input signal shown along side of the rubric DDRII DRAM DATA. This signal requires a setup period 100, entitled tDQSU, and a hold time 101 entitled TDQH.

In comparison the current circuit has been found to latch reliably when the input signal 102 as shown in FIG. 1A alongside the heading DATA LATCH INPUT OF CURRENT INVENTION. FIG. 1B shows the time required to the input signals of the current invention as compared to those of three prior art latches, labeled DDRII 553, DDRII 667 and DDRII 800. The current invention is shown to latch and hold after 155 picoseconds, as opposed to a minimum of 400 picoseconds for the prior art DDRII 800 device.

The device of the current invention described herein thus gives relief to times required for set up and hold to latch data reliably with lower speed silicon technologies and higher speed data.

DETAILED DESCRIPTION

Figure 4:
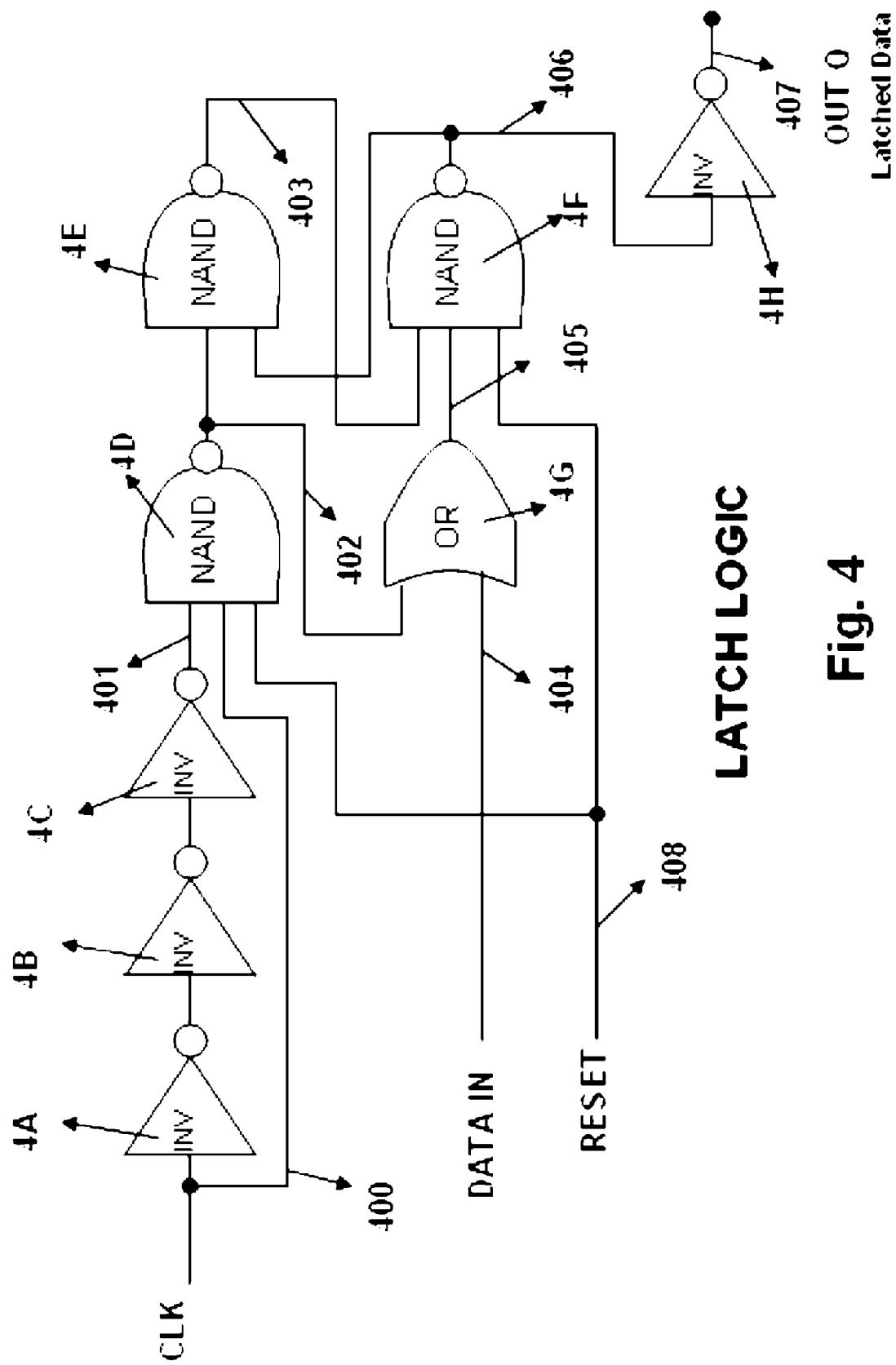
FIG. 4 depicts a circuit diagram of the present invention.
Figure 4A:
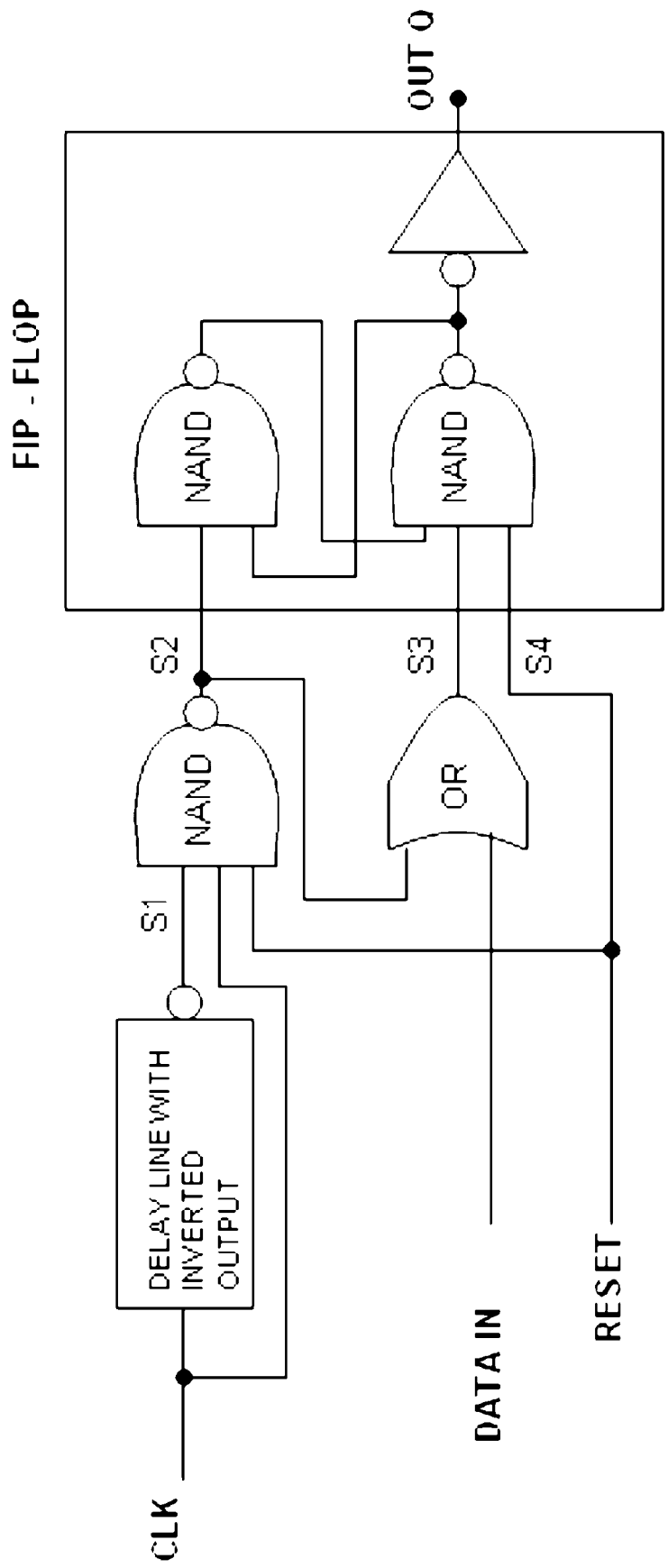
FIG. 4A depicts a simplified version of the circuit of FIG. 4.
Figure 5:
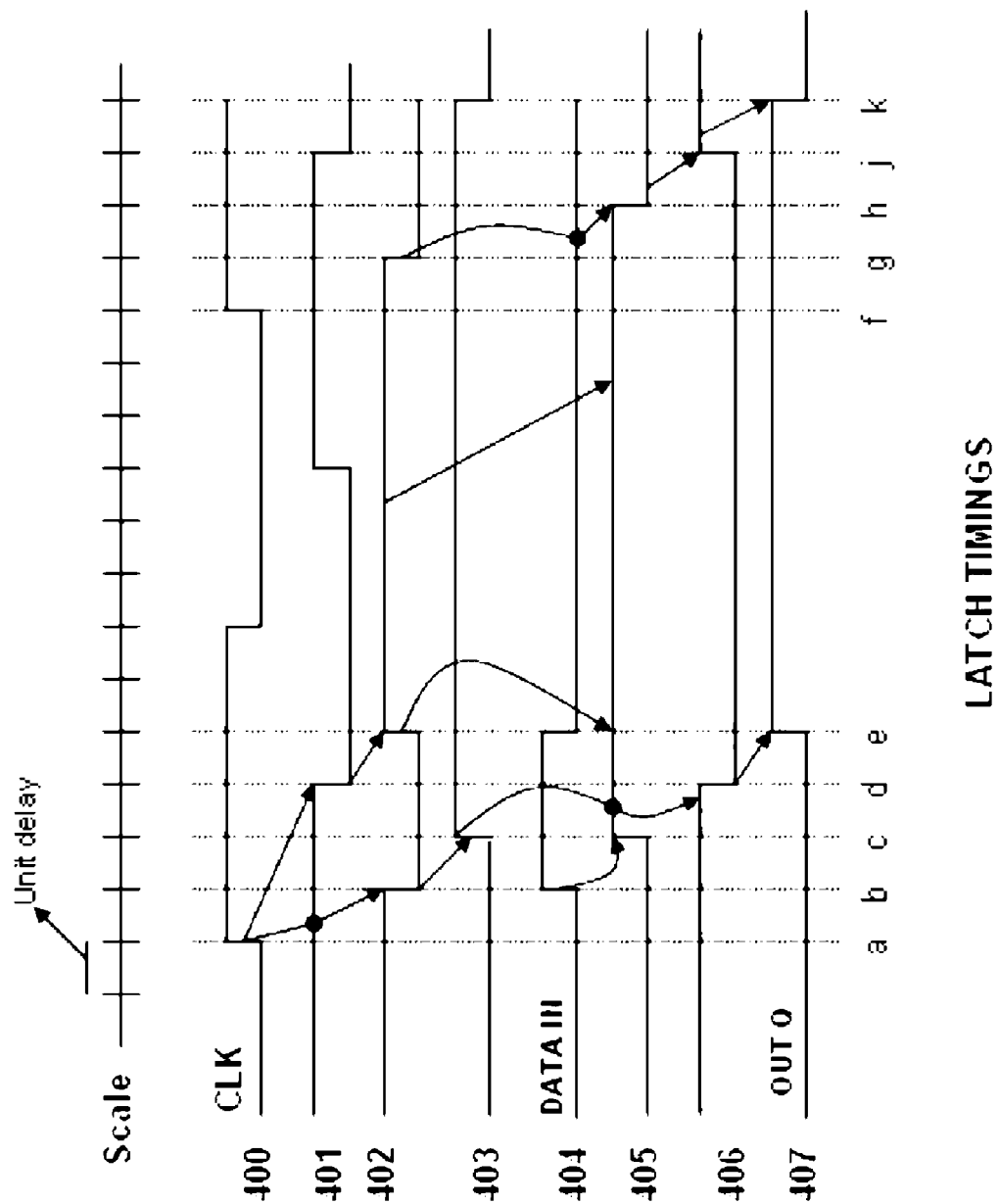
FIG. 5 depicts waveforms of various signals in the circuitry of the present invention.

Referring first to FIGS. 4 and 5, the latch of the current invention and the timing chart for the latch it is shown. FIG. 4B depicts a simplified version of the invention.

Referring first to FIG. 4, the invention contains four major elements: a three-unit inverting delay circuit 4A, 4B, 4C, a NAND circuit 4D, an OR circuit 4G, and a bi-stable FLIP-FLOP with elements 4E and 4F. An inverter 4H is connected to the output of 406 of the FLIP-FLOP. The delay circuit is used to delay the clock CLK by three delay units, and also inverts the delayed signal. The NAND circuit 4D performs a NAND function with the clock signal CLK, and the resultant signal drives one input of the FLIP-FLOP element 4E. The output of the NAND circuit 4D also drives one input of the OR gate 4G, the DATA IN signal driving the other input of the OR gate. The output of the OR gate drives the other input of the FLIP-FLOP element 4F.

It is assumed in the foregoing description that the NAND gate and OR gate delays the signal by one delay unit between input and output, as do the FLIP-FLOP elements.

Furthermore the clock signal CLK is assumed to have a period of 12 delay units. These parameters are based on the current high-speed silicon logic circuits available currently. The delay of three units was found to be ideal for such logic circuits, which correspond to the logic circuits used by Texas Instruments in circuits such as SN74AUV1G74. With different classes of logic circuits, with different speeds, the delays would be different than three delay units for proper operation.

Referring now to FIG. 5, the timing diagram for the latch is also shown. FIG. 4 depicts the detailed circuitry of the present invention. Referring first to FIG. 4, it is seen that the latch has three inputs, CLK 400, DATA IN, and RESET, and one output, OUT Q. The low level RESET signal is static and has no effect on the timings of the latch. It is assumed to be at high level for normal latch operation. After the latching process has been performed, and the latch has proceeded from a logic zero to a logic one, the RESET signal will cause it to return to logic zero, as in the prior art.

The CLK could be chosen to be the inverted edge of the externally applied phase without affecting the operation of the described latch.

For purposes of explanation it is assumed that each logic block has one unit delay.

The CLK 400 signal goes through three inverter blocks 4A, 4B and 4C to condition one input 401 of NAND gate 4D. The CLK 400 also conditions the other leg of the NAND gate 4D. Assuming that the CLK 400 starts from a low level, going through an odd number of inverters will cause the signal to be at a high level when it makes the transition from Low to Hi at time a, as shown in FIG. 5. One unit delay later time b, after the CLK 400 is applied, the output 402 of NAND 4D will transfer from Hi to Low level since both inputs are at Hi level. One unit delay later, at time c, output 403 of NAND block 4E goes Hi. This level conditions one leg of NAND block 4F. DATA IN 404, having started at time b, will propagate through OR block 4G and condition 405 HI at time c.

Leg 405 of the NAND block 4F acting simultaneously with leg 403 will make the output 406 of NAND block 4F to go low at time d, and will condition the leg of NAND block 4E to sustain the output 403 to a Hi level when 402 goes Hi. At time d, output 401 of block 4C goes low and a unit later at time e 402 output goes Hi. At the same time e, DATA IN 404 can go low without affecting the state of the latch. The leg 402 of the OR gate will hold the state of the latch through the next time g when 402 goes Low. The state of the latch is going to change only if the DATA IN is low at that time.

With 402 in Low state and DATA IN also low causes 405 to go Low at time h. At time j, 406 goes Hi and at time k output Q goes Low.

The above demonstrates the setting and resetting of the latch based on the state of the DATA IN signal when the transition of the CLK 400 from Low to Hi is applied. In this example the CLK cycle is 12 unit delays. The DATA IN signal is only 3 unit delays. And the output OUT Q has been latched for a period equal to the clock cycle, and then reset.

Although the preferred embodiment demonstrates the operation of the latch of the present invention having a periodic clock as input, the latch will operate with aperiodic signals connected to the CLK input 400 as well.

Furthermore, the delay of three delay units, based on the delay of the average component such as gates, inverters, etc. as a single delay unit, is clearly only a minimum. Delays of greater than three such delay units will cause the latching circuit to operate satisfactorily, although much longer delays may be undesirable for other, unrelated reasons.

While the invention has been described with reference to specific embodiments, it will be apparent that improvements and modifications may be made within the purview of the invention without departing from the scope of the invention defined in the appended claims.

What is claimed is:

1. An electronic latching circuit having inputs comprising a clock CLK signal and an input signal DATA IN, the circuit comprising:
   (a) an inverting delay circuit, having an input connected to CLK and having an output signal s1 whose output signal is inverted and delayed from CLK;
   (b) a NAND circuit comprising a first input connected to signal s1, a second input connected to the clock signal, and an output signal s2;
   an OR circuit comprising a first input connected to DATA IN, a second input connected to s2, and an output signal s3, and
   a FLIP-FLOP circuit comprising a first input connected to s2, and a second input connected to s3, and an output signal OUT Q.

2. The electronic latching circuit of claim 1, wherein the inverting delay circuit comprises a delay of at least three time increments each equal to tD, and wherein the NAND circuit, the OR circuit, and each element of the FLIP-FLOP circuit each have a delay equal to tD.

3. The electronic latching circuit of claim 2, wherein the clock CLK signal is periodic, and has a period of at least 12 tD.

4. The electronic latching circuit of claim 3, wherein the inverting delay circuit further comprises three inverters connected in series.

5. The electronic latching circuit of claim 4, wherein the flip-flop circuit further comprises two NAND gates, each comprising a first and second input and an output, an wherein:
   (a) the first input of the first NAND gate is connected to signal 4c;
   (b) the second input of the first NAND gate is connected to the output of the second NAND gate;
   (c) the first input of the second NAND gate is connected to the output of the first NAND gate; and
   (d) the second input of the second NAND gate is connected to signal 7c.

6. The electronic latching circuit of claim 2, wherein the inverting delay circuit further comprises three inverters connected in series.

7. The electronic latching circuit of claim 6, wherein the flip-flop circuit further comprises two NAND gates, each comprising a first and second input and an output, an wherein:
   (a) the first input of the first NAND gate is connected to signal 4c;
   (b) the second input of the first NAND gate is connected to the output of the second NAND gate;
   (c) the first input of the second NAND gate is connected to the output of the first NAND gate; and
   (d) the second input of the second NAND gate is connected to signal 7c.

* * * * *